(12) United States Patent
Hai

(10) Patent No.: US 11,362,154 B2
(45) Date of Patent: Jun. 14, 2022

(54) ARRAY SUBSTRATE, METHOD FOR MANUFACTURING SAME, AND DISPLAY DEVICE

(71) Applicant: BOE Technology Group Co., Ltd., Beijing (CN)

(72) Inventor: Xiaoquan Hai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 153 days.

(21) Appl. No.: 16/930,433

(22) Filed: Jul. 16, 2020

(65) Prior Publication Data

US 2021/0134898 A1 May 6, 2021

(30) Foreign Application Priority Data

Oct. 30, 2019 (CN) .......................... 201911043595.8

(51) Int. Cl.
*H01L 27/32* (2006.01)
*H01L 51/56* (2006.01)
*G06V 40/13* (2022.01)

(52) U.S. Cl.
CPC ...... *H01L 27/3227* (2013.01); *G06V 40/1318* (2022.01); *H01L 27/3232* (2013.01); *H01L 27/3234* (2013.01); *H01L 27/3244* (2013.01); *H01L 51/56* (2013.01); *H01L 2227/323* (2013.01); *H01L 2251/303* (2013.01)

(58) Field of Classification Search
None
See application file for complete search history.

(56) References Cited

U.S. PATENT DOCUMENTS

2017/0357840 A1 12/2017 Chen et al.
2018/0158877 A1 6/2018 Zeng et al.
(Continued)

FOREIGN PATENT DOCUMENTS

CN 107066976 A 8/2017
CN 107480579 A 12/2017
(Continued)

OTHER PUBLICATIONS

First office action of Chinese application No. 201911043595.8 dated Jun. 3, 2021.

*Primary Examiner* — J. E. Schoenholtz
(74) *Attorney, Agent, or Firm* — Fay Sharpe LLP

(57) ABSTRACT

Disclosed are an array substrate, a method for manufacturing the same, and a display device. The array substrate includes a base substrate and an organic light-emitting diode (OLED), a photoelectric conversion layer and a light-filtering layer which are on the base substrate, wherein the OLED and the light-filtering layer both are on a side, distal from the base substrate, of the photoelectric conversion layer, an orthographic projection of the photoelectric conversion layer on the base substrate is at least partially overlapped with an orthographic projection of the light-filtering layer on the base substrate, the orthographic projection of the photoelectric conversion layer on the base substrate is outside an orthographic projection of the OLED on the base substrate, the light-filtering layer is light transmittable, and a transmittance of the light-filtering layer to light in a target band is smaller than or equal to a transmittance thresholds.

20 Claims, 7 Drawing Sheets

(56) References Cited

U.S. PATENT DOCUMENTS

| | | | |
|---|---|---|---|
| 2020/0334436 A1 | 10/2020 | Xu et al. | |
| 2021/0034832 A1* | 2/2021 | Lee | H01L 27/3244 |
| 2021/0149096 A1 | 5/2021 | Meng et al. | |
| 2021/0217819 A1* | 7/2021 | Lius | H01L 27/322 |

FOREIGN PATENT DOCUMENTS

| | | |
|---|---|---|
| CN | 107680988 A | 2/2018 |
| CN | 109033926 A | 12/2018 |
| CN | 109411504 A | 3/2019 |
| CN | 109891278 A | 6/2019 |

* cited by examiner

Forming an OLED, a photoelectric conversion layer and a light-filtering layer on a base substrate, wherein the OLED and the light-filtering layer both are on a side, distal from the base substrate, of the photoelectric conversion layer; an orthographic projection of the photoelectric conversion layer on the base substrate is at least partially overlapped at least partially overlaps an orthographical projection of the light-filtering layer on the base substrate; the orthographic projection of the photoelectric conversion layer falls out of an orthographic projection of the OLED on the base substrate; and the light-filtering is light transmittable, a transmittance of the light-filtering layer to light in a target band being smaller than or equal to a transmittance threshold, a minimum value of the target band being greater than 60 nanometers

ARRAY SUBSTRATE, METHOD FOR MANUFACTURING SAME, AND DISPLAY DEVICE

CROSS-REFERENCE TO RELATED APPLICATIONS

This application claims priority to Chinese Patent Application No. 201911043595.8, filed on Oct. 30, 2019 and entitled "ARRAY SUBSTRATE, METHOD FOR MANUFACTURING SAME, AND DISPLAY DEVICE", the entire contents of which are incorporated herein by reference.

TECHNICAL FIELD

The present disclosure relates to an array substrate, a method for manufacturing the same, and a display device.

BACKGROUND

With the development of display technologies, more and more display devices are integrated with fingerprint recognition functions.

In the display devices integrated with the fingerprint recognition functions, the array substrate generally includes a base substrate, and an organic light-emitting diode (OLED) and a photoelectric conversion layer which are disposed on the base substrate.

SUMMARY

The present disclosure provides an array substrate, a method for manufacturing the same, and a display device. The technical solutions are as follows:

In one aspect, an array substrate is provided. The array substrate includes a base substrate and an organic light-emitting diode (OLED), a photoelectric conversion layer, and a light-filtering layer which are on the base substrate; wherein the OLED and the light-filtering layer are both on a side, distal from the base substrate, of the photoelectric conversion layer, an orthographic projection of the photoelectric conversion layer on the base substrate at least partially overlapped with an orthographic projection of the light-filtering layer on the base substrate, and the orthographic projection of the photoelectric conversion layer on the base substrate is outside an orthographic projection of the OLED on the base substrate; and the light-filtering layer is light transmittable, and a transmittance of the light-filtering layer to light in a target band is smaller than or equal to a transmittance threshold, a minimum value of the target band being greater than 600 nanometers.

Optionally, the transmittance of the light-filtering layer to light with at least a part of wavelengths outside the target band is greater than the transmittance threshold.

Optionally, the light-filtering layer includes a plurality of first film layers and a plurality of second film layers. In the light-filtering layer, the first film layers and the second film layers are alternatively overlapped in a direction going distally from the base substrate, and refractive indexes of the first film layers are greater than those of the second film layers.

Optionally, a material of the first film layers includes trititanium pentoxide, and a material of the second film layers includes silica.

Optionally, the at least a part of wavelengths includes wavelengths from 480 nanometers to 580 nanometers.

Optionally, the transmittance threshold is one hundredth.

Optionally, a material of the light-filtering layer includes resin.

Optionally, a material of the first film layers includes trititanium pentoxide, and a material of the second film layers includes silica.

Optionally, the light-filtering layer includes six first film layers and six second film layers.

Optionally, the light-filtering layer is between the photoelectric conversion layer and an electro-luminescence layer of the OLED.

Optionally, the array substrate further includes an auxiliary substrate and conforms to any one of the following conditions:

the auxiliary substrate is between the photoelectric conversion layer and the light-filtering layer; and the auxiliary substrate is between the light-filtering layer and the OLED.

Optionally, the array substrate further includes an auxiliary substrate and an optical collimating layer and conforms to any one of the following conditions:

the auxiliary substrate is between the photoelectric conversion layer and the light-filtering layer, and the optical collimating layer is between the photoelectric conversion layer and the auxiliary substrate; and the auxiliary substrate is between the light-filtering layer and the OLED, and the optical collimating layer is between the auxiliary substrate and the light-filtering layer.

Optionally, the light-filtering layer is on a side, distal from the base substrate, of the electro-luminescence layer of the OLED.

Optionally, the array substrate further includes an auxiliary substrate between the photoelectric conversion layer and the OLED.

Optionally, the array substrate further includes an optical collimating layer between the photoelectric conversion layer and the auxiliary substrate.

Optionally, the transmittance threshold is one hundredth, and the array substrate conforms to any one condition in a first condition set and any one condition in a second condition set; wherein the first condition set includes:

a material of the light-filtering layer includes resin;

the light-filtering layer includes six first film layers and six second film layers, wherein in the light-filtering layer, the first film layers and the second film layers are alternatively overlapped in a direction going distally from the base substrate, a material of the first film layers includes trititanium pentoxide, and a material of the second film layers includes silica; and the light-filtering layer includes six first film layers and six second film layers, wherein in the light-filtering layer, the first film layers and the second film layers are alternatively overlapped in a direction going distally from the base substrate, a material of the first film layers includes titanium oxide, and a material of the second film layers includes silica;

the second condition set includes:

the light-filtering layer is between the photoelectric conversion layer and the electro-luminescence layer of the OLED;

the light-filtering layer is between the photoelectric conversion layer and the electro-luminescence layer of the OLED, and the array substrate further includes an auxiliary substrate between the photoelectric conversion layer and the light-filtering layer;

the light-filtering layer is between the photoelectric conversion layer and the electro-luminescence layer of the OLED, and the array substrate further includes an auxiliary substrate between the light-filtering layer and the OLED;

the light-filtering layer is between the photoelectric conversion layer and the electro-luminescence layer of the OLED, and the array substrate further includes an auxiliary substrate and an optical collimating layer, wherein the auxiliary substrate is between the photoelectric conversion layer and the light-filtering layer, and the optical collimating layer is between the photoelectric conversion layer and the auxiliary substrate;

the light-filtering layer is between the photoelectric conversion layer and the electro-luminescence layer of the OLED, and the array substrate further includes an auxiliary substrate and an optical collimating layer, wherein the auxiliary substrate is between the light-filtering layer and the OLED, and the optical collimating layer is between the auxiliary substrate and the light-filtering layer;

the light-filtering layer is between the photoelectric conversion layer and the electro-luminescence layer of the OLED and the array substrate further includes an auxiliary substrate and an optical collimating layer, wherein the auxiliary substrate is between the light-filtering layer and the OLED, and the optical collimating layer is between the photoelectric conversion layer and the light-filtering layer;

the light-filtering layer is on a side, distal from the base substrate, of the electro-luminescence layer of the OLED;

the light-filtering layer is on a side, distal from the base substrate, of the electro-luminescence layer of the OLED and the array substrate further includes an auxiliary substrate between the photoelectric conversion layer and the OLED; and the light-filtering layer is on a side, distal from the base substrate, of the electro-luminescence layer of the OLED, and the array substrate further includes an auxiliary substrate between the photoelectric conversion layer and the OLED and an optical collimating layer between the photoelectric conversion layer and the auxiliary substrate.

In another aspect, a method for manufacturing an array substrate is provided. The method is used for manufacturing any one of array substrates according to the present disclosure, and the method includes:

forming an OLED, a photoelectric conversion layer and a light-filtering layer on a base substrate;

wherein the OLED and the light-filtering layer are both on a side, distal from the base substrate, of the photoelectric conversion layer, an orthographic projection of the photoelectric conversion layer on the base substrate is at least partially overlapped with an orthographic projection of the light-filtering layer on the base substrate, and the orthographic projection of the photoelectric conversion layer on the base substrate is outside an orthographic projection of the OLED on the base substrate; and the light-filtering layer is light transmittable, and a transmittance of the light-filtering layer to light in a target band is smaller than or equal to a transmittance threshold, a minimum value of the target band being greater than 600 nanometers.

In yet another aspect, a display device is provided. The display device includes any one of array substrates according to the present disclosure.

BRIEF DESCRIPTION OF THE DRAWINGS

FIG. 12 is a flowchart of a method for manufacturing an array substrate according to an embodiment of the present disclosure.

DETAILED DESCRIPTION OF EMBODIMENTS

For clearer descriptions of the principle and the technical solutions of the present disclosure, further detailed description will be made on specific embodiments hereinafter with reference to the accompanying drawings.

Figure 1:
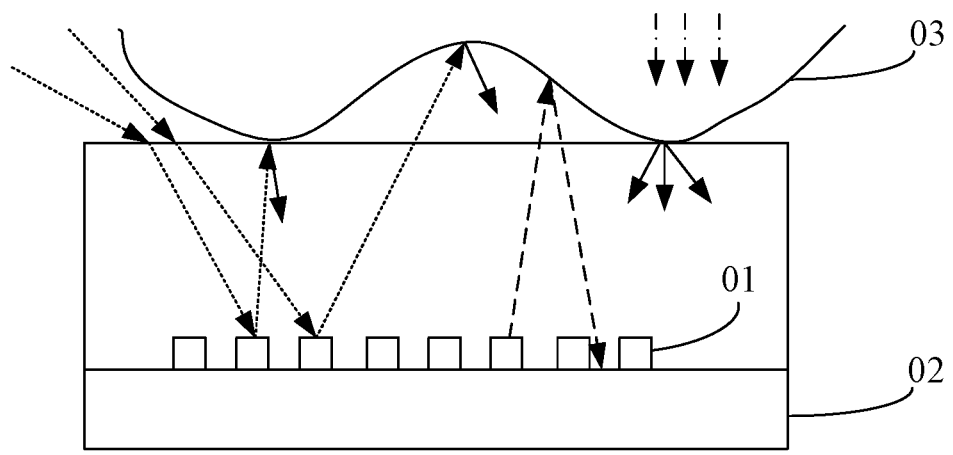
FIG. 1 is a schematic structural diagram of an array substrate according to an embodiment of the present disclosure.

FIG. 1 is a schematic structural diagram of an array substrate in a display device having a fingerprint recognition function according to an embodiment of the present disclosure. As shown in FIG. 1, the array substrate generally includes a base substrate (now shown in FIG. 1) and an OLED 01 and a photoelectric conversion layer 02 for fingerprint recognition, which are disposed on the base substrate.

During fingerprint recognition of the display device, the OLED 01 may emit light X1 to a display side of the display device, in this case, if a finger 03 of a user touches the display side of the display device, the light X, emitted from the OLED 01, may be reflected to the photoelectric conversion layer 02 by the finger. The photoelectric conversion layer 02 may generate an electrical signal for fingerprint recognition to facilitate subsequent fingerprint recognition based on the light X1 reflected by the finger. For example, the display device further includes a fingerprint recognition chip, and the fingerprint recognition chip may carry out fingerprint recognition based on the electrical signal.

However, ambient light in an environment where the display device is disposed may also be emitted to a finger 03 of the user by various modes, for example, the ambient light X21 emitted to the finger 03 from a side, distal from the display device, of the finger 03, and ambient light X22 emitted into the display device from a side face of the finger 03 and then reflected to the finger 03 from the display device. Biological tissue in the finger 03 will be excited to emit pigment light X3 to the photoelectric conversion layer by the ambient light emitted to the finger 03, and the pigment light X3 will intervene the light X1, resulting in influence on the accuracy of fingerprint recognition.

The embodiment of the present disclosure provides a display device and the array substrate therein. The array substrate may reduce the interference of the pigment light X3 on fingerprint recognition.

Figure 2:
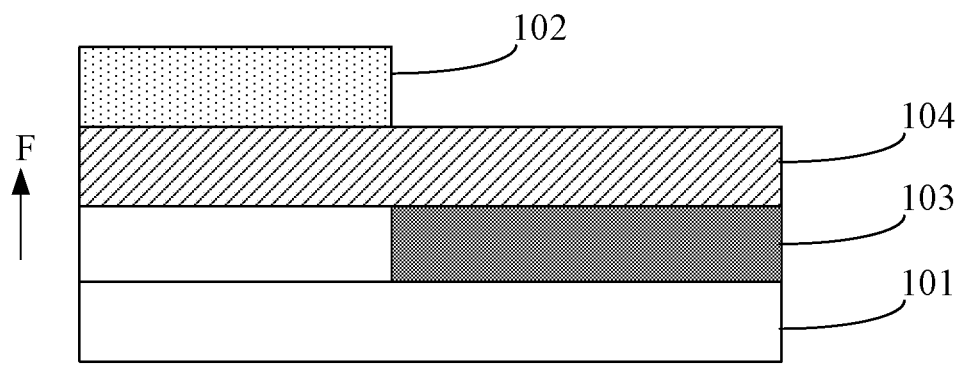
FIG. 2 is a schematic structural diagram of another array substrate according to an embodiment of the present disclosure.

Exemplarily, FIG. 2 is a schematic structural diagram of an array substrate according to an embodiment of the present disclosure. As shown in FIG. 2, the array substrate 10 includes a base substrate 101, an OLED 102, a photoelectric conversion layer 103 and a light-filtering layer 104.

The photoelectric conversion layer 103, the light-filtering layer 104 and the OLED 102 are all disposed on the same side of the base substrate 101. The OLED 102 and the light-filtering layer 104 are both disposed on a side, distal from the base substrate 101, of the photoelectric conversion layer 103. The photoelectric conversion layer 103 and the light-filtering layer 104 are sequentially disposed in a direction F going distally from the base substrate 101, and the OLED 102 and the light-filtering layer 104 are also sequentially disposed in the direction F going distally from the base substrate 101. It should be noted that the embodiment of the present disclosure is not limited to relative position of the OLED 102 and the light-filtering layer 104, for example, the light-filtering layer 104 may be disposed on a side, proximal to or distal from the base substrate, of the OLED 102, or the light-filtering layer 104 may be disposed between the electro-luminescence layer of the OLED 102 and a certain electrode.

An orthographic projection of the photoelectric conversion layer 103 on the base substrate 101 at least partially overlaps an orthographic projection of the light-filtering layer 104 on the base substrate 101. The orthographic projection of the photoelectric conversion layer 103 on the base substrate 101 falls out of an orthographic projection of the OLED 102 on the base substrate 101.

The light-filtering layer 104 transmits light, and the transmittance of the light-filtering layer 104 to light in a target band is smaller than or equal to a transmittance threshold, and the minimum value of target band is greater than 600 nanometers. The transmittance of the light-filtering layer 104 to light in the target band is smaller than or equal to the transmittance threshold, illustrating that a large amount of light in the target band will be filtered by the light-filtering layer 104 and may not transmit through the light-filtering layer. The transmittance threshold may be a transmittance such as 1%, 2% or 10%, which is not limited in the embodiment of the present disclosure.

Figure 3:
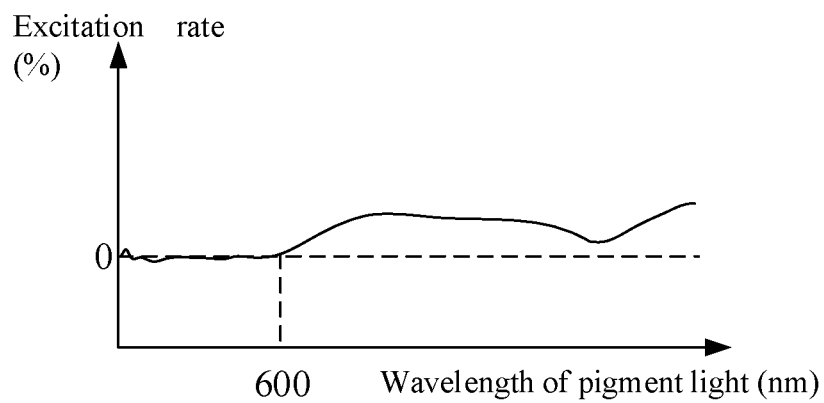
FIG. 3 is a schematic view of a corresponding relation between a wavelength of pigment light excited by a finger and an excitation rate according to an embodiment of the present disclosure.

Optionally, the target band is correlated to the wavelength of the pigment light excited by the finger. For example, FIG. 3 is a schematic view of a corresponding relation between a wavelength of pigment light excited by a finger and an excitation rate according to an embodiment of the present disclosure. As shown in FIG. 3, the excitation rate corresponding to each wavelength indicates probability of pigment light with the wavelength excited by a finger. A horizontal axis in the FIG. 3 indicates the wavelength of pigment light, nanometer (nm) being the unit, and a longitudinal axis indicates the excitation rate, percent (%) being the unit. As seen from FIG. 3, the wavelength of the pigment light excited by the finger is generally 600 nm or above. Therefore, when the minimum value of a target band is greater than 600 nm, a large amount of pigment light may be filtered by a light-filtering layer to reduce interference of the pigment light on fingerprint recognition.

Optionally, transmittance of a light-filtering layer 104 to light with at least a part of wavelengths outside the target band is greater than the transmittance threshold. Generally, the wavelengths of light for fingerprint recognition emitted from an OLED fall out of the target band, and when the transmittance of the light-filtering layer 104 to light with at least a part of wavelengths outside the target band is greater than the transmittance threshold, it indicates that a larger amount of light for fingerprint recognition emitted from the OLED may be emitted to a photoelectric conversion layer after being reflected by the finger of a user, such that effective fingerprint recognition may be ensured.

Figure 4:
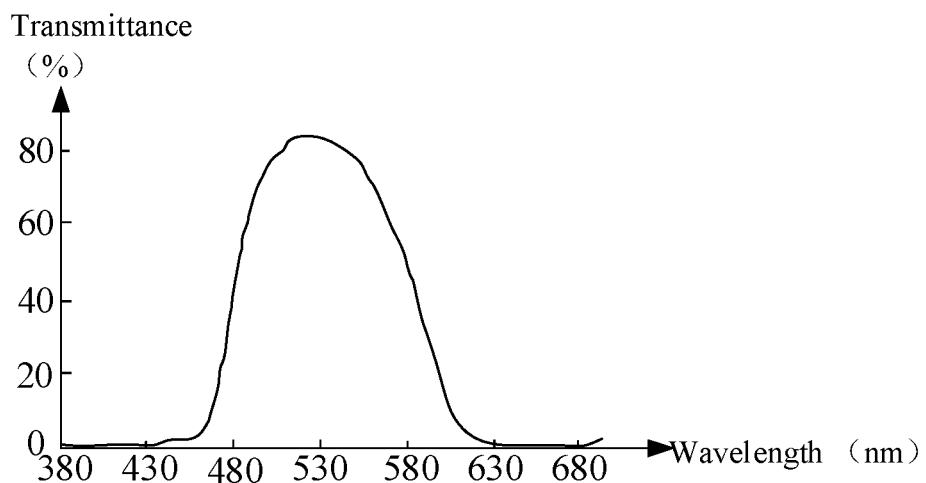
FIG. 4 is a schematic view of transmittance of a light-filtering layer according to an embodiment of the present disclosure.

Optionally, the at least a part of wavelengths may include wavelengths from 480 nanometers to 580 nanometers. Exemplarily, FIG. 4 is a schematic view light of transmittance of a light-filtering layer according to an embodiment of the present disclosure. As shown in FIG. 4, a horizontal axis in the FIG. 4 indicates wavelengths of light, nanometer (nm) being the unit, and a longitudinal axis indicates excitation rate of a light-filtering layer to the light, percent (%) being the unit. As seen from FIG. 4, the wavelengths of the light having the transmittance greater than a transmittance threshold on the light-filtering layer mainly fall between 480 nm and 580 nm when the transmittance threshold is 1%.

In conclusion, in the array substrate according to the embodiment of the present disclosure, the light-filtering layer is disposed on a side, distal from the base substrate, of the photoelectric conversion layer and may filter a large amount of light with wavelengths greater than 600 nm. However, wavelengths of pigment light are generally 600 nm or above, such that a large amount of pigment light excited by a finger of a user may be filtered by the light-filtering layer, thereby reducing the pigment light emitted to the photoelectric conversion layer. Therefore, the interference degree of the pigment light on fingerprint recognition may be reduced, and the accuracy of fingerprint recognition is improved.

The light-filtering layer 104 in the embodiment of the present disclosure may be practiced in various implementations. Description will be made on a structure of the light-filtering layer 104 by taking the following two implementations in the embodiment of the present disclosure as examples.

In a first implementation of the light-filtering layer 104, a material of the light-filtering layer includes resin. Exemplarily, a material of resin may be the same as a material of a green photoresist.

Figure 5:
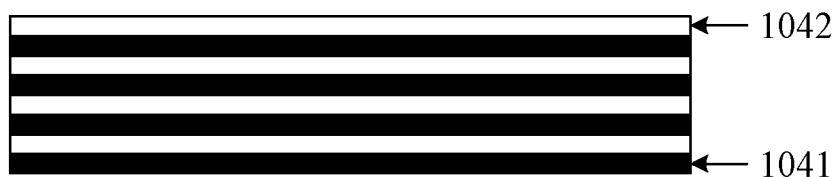
FIG. 5 is a schematic structural diagram of a light-filtering layer according to an embodiment of the present disclosure.

In a second implementation of the light-filtering layer 104, as shown in FIG. 5, the light-filtering layer 104 includes a plurality of first film layers 1041 and a plurality of second film layers 1042. In the light-filtering layer 104, the first film layers 1041 and the second film layers 1042 are alternatively overlapped in a direction going distally from a base substrate, and refractive indexes of the first film layers 1041 are greater than those of the second film layers 1042. The embodiment of the present disclosure is not limited to layers of the first film layers 1041 and the second film layers 1042. Exemplarily, the layers of the first film layers 1041 and the layers of the second film layers 1042 may be 6, 17, 18, 19 and the like. FIG. 5 takes the case where the numbers of layers of the first film layers 1041 and the second film layers 1042 are both 4 as an example. It should be noted that the first film layers 1041 and the second film layers 1042 in the light-filtering layer 104 are alternatively overlapped in the direction going distally from the base substrate, and the film layers, most proximal to the base substrate, of the plurality of first film layers 1041 and the plurality of second film layers 1042, are the first film layers 1041.

Exemplarily, a material of the first film layers 1041 may include silicon nitride (SiNx), and a material of the second film layers 1042 may include silicon oxide (SiOx). Exemplarily again, the material of the first film layers 1041 may include titanium dioxide (TiO2), and the material of the second film layers 1042 may include silica (SiO2). Exemplarily again once more, the material of the first film layers 1041 may include trititanium pentoxide (Ti3O5), and the material of the second film layers 1042 may include SiO2. It should be noted that when the material of the first film layers 1041 includes Ti3O5, the material of the second film layers 1042 includes SiO2, and the first film layers 1041 and the second film layers 1042 are both formed by a sputtering mode, temperatures of the formed first film layers 1041 and the formed second film layers 1042 are both low, not resulting in influence on the film layer (such as a photoelectric conversion layer) which has been formed on the base substrate. Therefore, high preparation yield of the array substrate is ensured.

Optionally, a thickness of the light-filtering layer 104 in the embodiment of the present disclosure may be 1.071 micrometers, 1 micrometer, 0.14 micrometers, 0.15 micrometers, 0.16 micrometers, or the like.

Furthermore, a structure of the array substrate according to the embodiment of the present disclosure may also have various implementations, which is not limited in the embodiment of the present disclosure. Description will be given by taking the following several implementations of the structure of the array substrate as examples.

1. First Implementation

Figure 6:
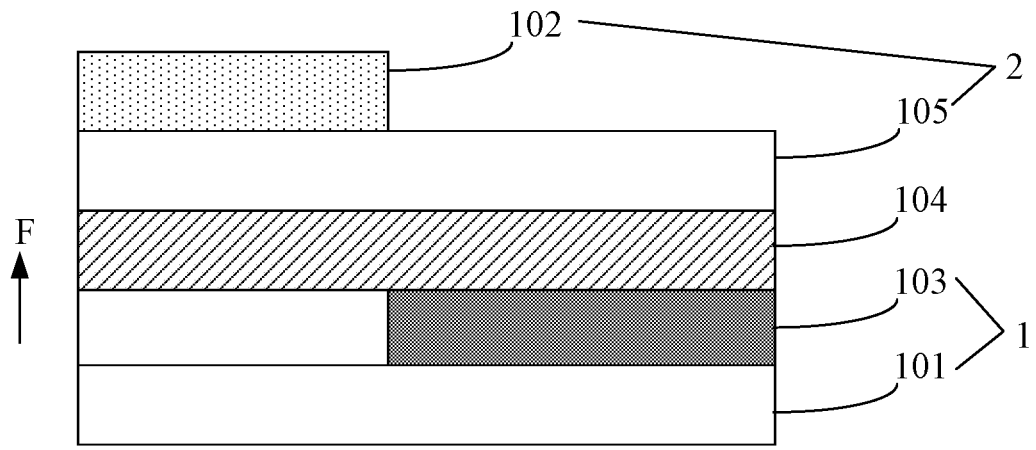
FIG. 6 is a schematic structural diagram of another array substrate according to an embodiment of the present disclosure.

As shown in FIG. 6, based on FIG. 2, the array substrate further includes an auxiliary substrate 105, and the photoelectric conversion layer 103, the light-filtering layer 104, the auxiliary substrate 105 and the OLED 102 are sequentially disposed in a direction F distal from a base substrate 101.

As seen in the first implementation of the structure of the array substrate, the array substrate includes a fingerprint recognition module 1 (including the base substrate 101 and the photoelectric conversion layer 103) for fingerprint recognition, an OLED module (including the auxiliary substrate 105 and the OLED 102) for light emitting and the light-filtering layer 104, wherein the light-filtering layer 104 is disposed between the fingerprint recognition module 1 and the OLED module 2. Exemplarily, the light-filtering layer 104 may be disposed on a surface, proximal to the OLED module 2, of the fingerprint recognition module 1, or the light-filtering layer 104 may be disposed on a surface, proximal to the base substrate 101, of the OLED module 2.

Figure 7:
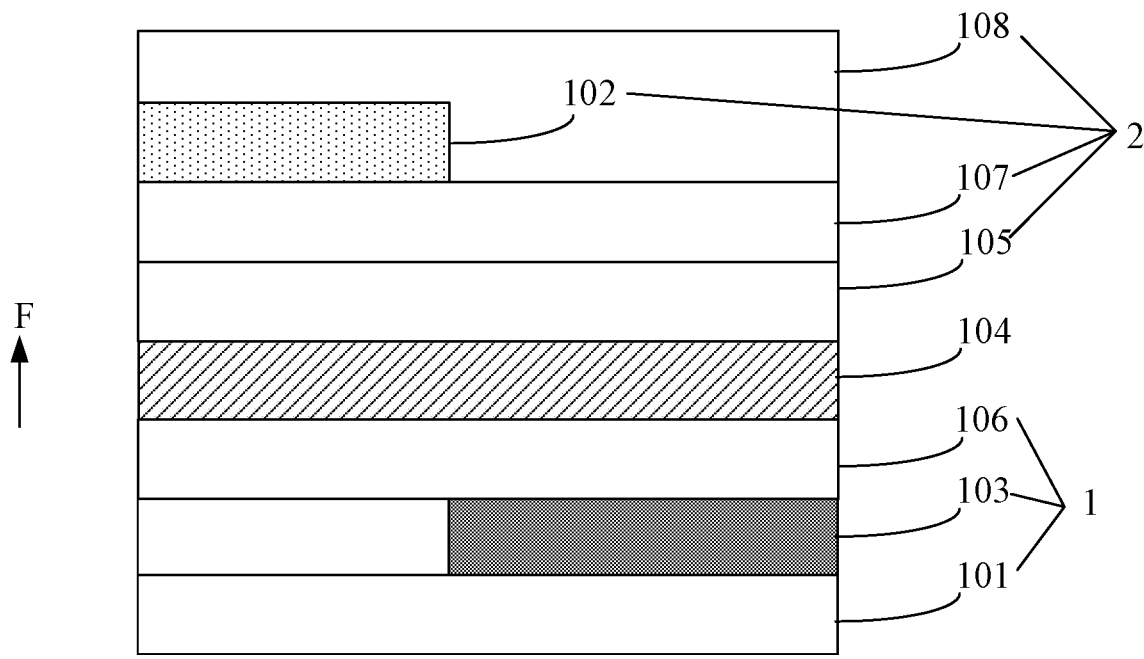
FIG. 7 is a schematic structural diagram of another array substrate according to an embodiment of the present disclosure.

Optionally, as shown in FIG. 7, based on FIG. 6, an array substrate includes at least one first insulating layer 106, at least one second insulating layer 107, and at least one third insulating layer 108. It should be noted that only one first insulating layer 106, only one second insulating layer 107, and only one third insulating layer 108 are shown in FIG. 7. The first insulating layer 106 is disposed between the photoelectric conversion layer 103 and the auxiliary substrate 105 (in FIG. 7 taking the case where the first insulating layer 106 is disposed between the photoelectric conversion layer 103 and the light-filtering layer 104 as an example, the first insulating layer 106 may also be disposed between the light-filtering layer 104 and the base substrate 105). The second insulating layer 107 is disposed between the auxiliary substrate 105 and the electro-luminescence layer of the OLED 102 (in FIG.7, taking the case where the shown OLED only includes the electro-luminescence layer as an example). The third insulation layer 108 is disposed on a side, distal from the base substrate 101, of the electro-luminescence layer of the OLED 102. In the embodiment of the present disclosure, the at least one first insulating layer 106 may belong to the fingerprint recognition module 1, and the at least one second insulating layer 107 may belong to the OLED module 2.

Figure 8:
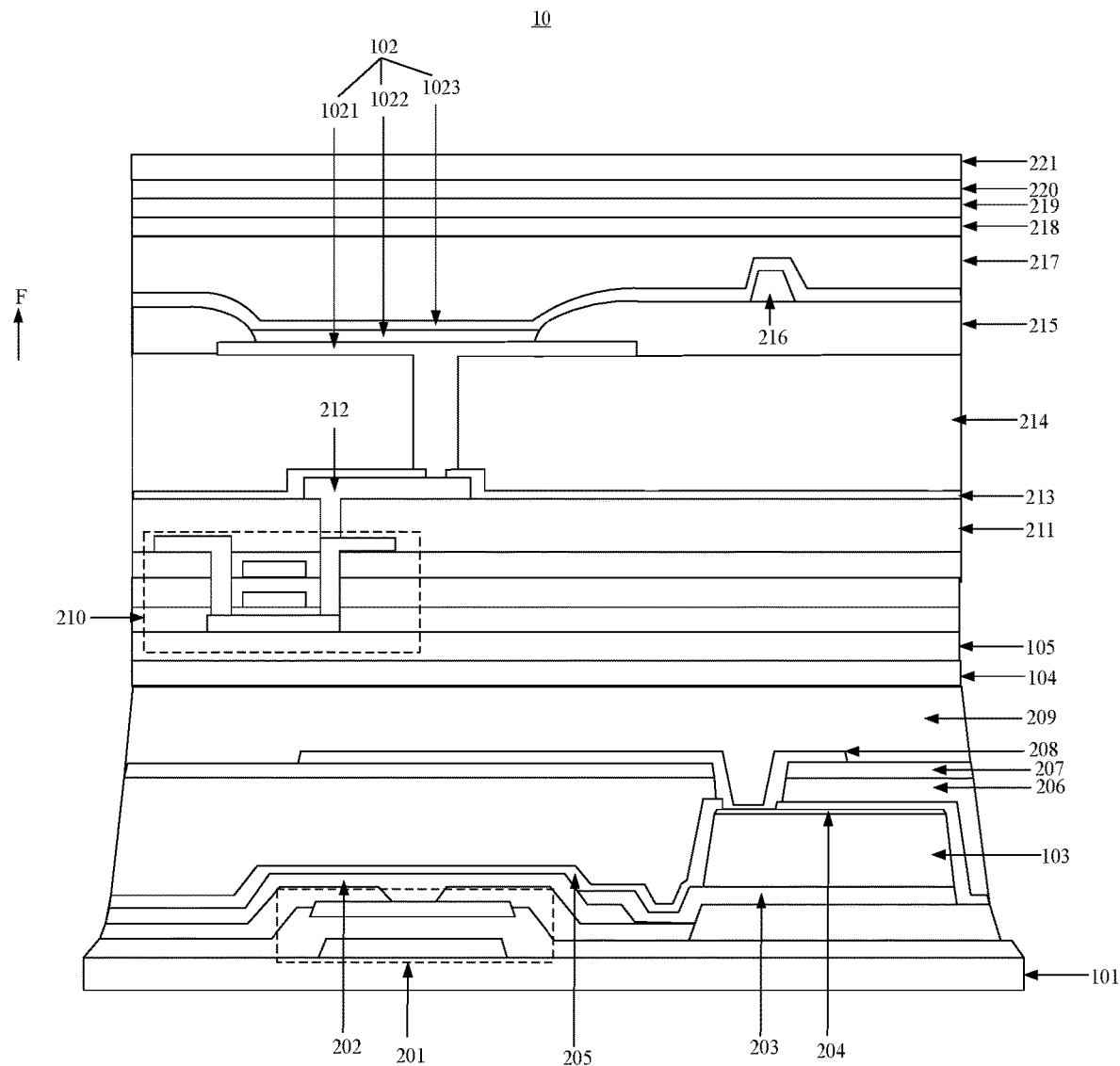
FIG. 8 is a schematic structural diagram of another array substrate according to an embodiment of the present disclosure.

Furthermore, as shown in FIG. 8, an array substrate includes a photoelectric drive circuit 201, a first passivation layer 202, a first electrode 203, a second electrode 204, a first coverage layer 205, a first flat layer 206, a second passivation layer 207, a third electrode 208 (may only include an electrode, or may not only include the electrode but also a light-shielding metal), a first buffer layer 209, an OLED drive circuit 210, a third flat layer 211, a connecting electrode 212, a second coverage layer 213, a second flat layer 214, a pixel defining layer 215, a support structure 216, a packaging layer 217, a first optionally clear adhesive (OCA) layer 218, a polarization and touch layer 219, a second OCA layer 220, and a cover plate 221 which are disposed on a base substrate 101 and sequentially disposed in a direction going distally from the base substrate 101.

The auxiliary substrate 105 may be disposed between the first buffer layer 209 and the OLED drive circuit 210. The OLED 102 may include a first OLED electrode 1021, an electro-luminescence layer 1022 and a second OLED electrode 1023 which are sequentially arranged along a direction going distally from the base substrate 101. Furthermore, the OLED 102 may be disposed between the second flat layer 214 and the packaging layer 217. The first coverage layer 205, the first flat layer 206, the second passivation layer 207, and the first buffer layer 209 may all be a first insulating layer of the array substrate. The insulating layer in the OLED drive circuit 210, the third passivation layer 211, the second coverage layer 213, the second flat layer 214, and the pixel defining layer 215 may all be a second insulating layer of the array substrate. The packaging layer 217, the first OCA layer 218, the insulating layer in the polarization and touch layer 219, the second OCA layer 220, and the cover plate 221 may all be a third insulating layer of the array substrate.

Exemplarily, the photoelectric drive circuit 201 and the OLED drive circuit 210 both may include one or more thin film transistors, also may include capacitors. Only one thin film transistor in the photoelectric drive circuit 201 and only one thin film transistor (not shown in FIG. 8) and only one capacitor (not shown in FIG. 8) in the OLED drive circuit 210 are shown in FIG. 8.

Optionally, the light-filtering layer 104 may also be disposed on a side, proximal to or distal from the base substrate 101, of the OLED module 2, or the light-filtering layer 104 may also be disposed between the first OLED electrode 1021 and the electro-luminescence layer 1022 of the OLED module 2, or the light-filtering layer 104 may also be disposed between the electro-luminescence layer 1022 and the second OLED electrode 1023 of the OLED module 2.

2. Second Implementation

In the second implementation, the light-filtering layer 104 in the first implementation may be omitted, and at least one structure of an auxiliary substrate 105, at least one first insulating layer 106, at least one second insulating layer 107 and at least one third insulating layer 108 is multiplexed to form the light-filtering layer (for example, the at least one structure is the light-filtering layer). Exemplarily, the at least one structure may be the auxiliary substrate 105, the first coverage layer 205, the second coverage layer 213, the second flat layer 214, or the like in FIG. 8.

3. Third Implementation

Figure 9:
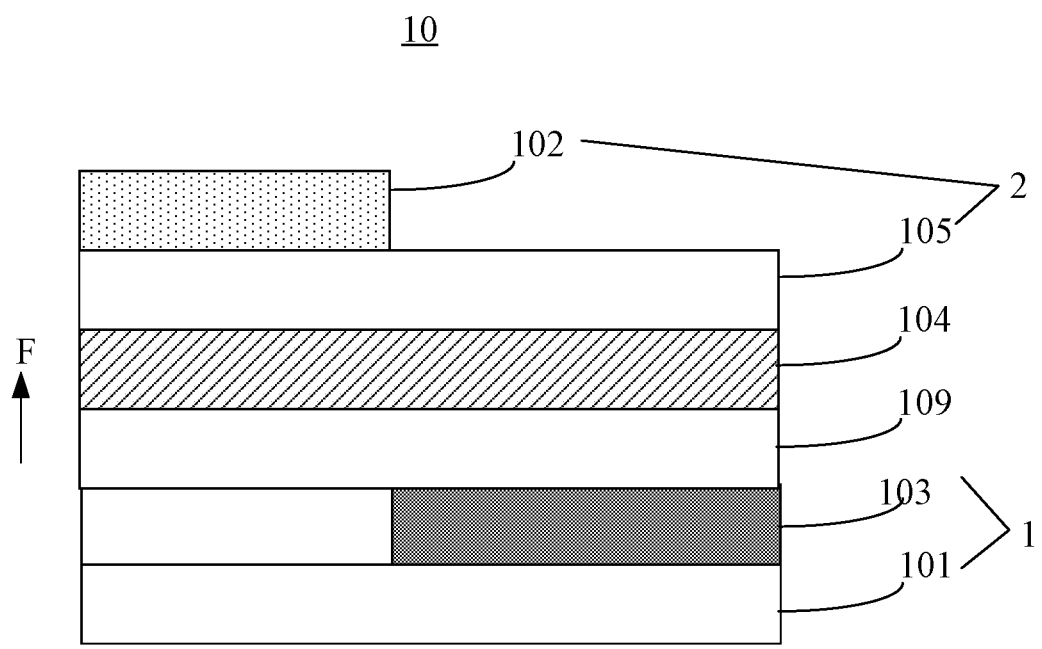
FIG. 9 is a schematic structural diagram of another array substrate according to an embodiment of the present disclosure.

An optical collimating layer may be disposed between the photoelectric conversion layer and the auxiliary substrate based on the first implementation or the second implementation. For example, as shown in FIG. 9, an optical collimating layer 109 may be disposed between the fingerprint recognition module 1 and the OLED module 2 in the first implementation. Meanwhile, a light-filtering layer 104 may be disposed between the optical collimating layer 109 and the fingerprint recognition module 1, or the light-filtering layer 104 may be disposed between the optical collimating layer 109 and the OLED module 2. For example, in FIG. 9, the light-filtering layer 104 may be disposed between the optical collimating layer 109 and the OLED module 2.

Exemplarily, when the light-filtering layer 104 is disposed between the optical collimating layer 109 and the fingerprint recognition module 1, the light-filtering layer 104 may be disposed on a surface, proximal to the OLED module 2, of the fingerprint recognition module 1, or the light-filtering layer 104 may be disposed on a surface, proximal to the base substrate 101, of the optical collimating layer 109. When the light-filtering layer 104 is disposed between the optical collimating layer 109 and the OLED module 2, the light-filtering layer 104 may be disposed on a surface, distal from the base substrate 101, of the optical collimating layer 109, or the light-filtering layer 104 may be disposed on a surface, proximal to the base substrate 101, of the OLED module 2.

4. Fourth Implementation

In the first implementation to the third implementation, the photoelectric conversion layer is disposed on the base substrate, and the OLED is disposed on the auxiliary substrate. In the fourth implementation, an array substrate does not include an auxiliary substrate, and the photoelectric conversion layer and the OLED may both be disposed on the base substrate and may be sequentially disposed in a direction going distally from the base substrate.

Figure 10:
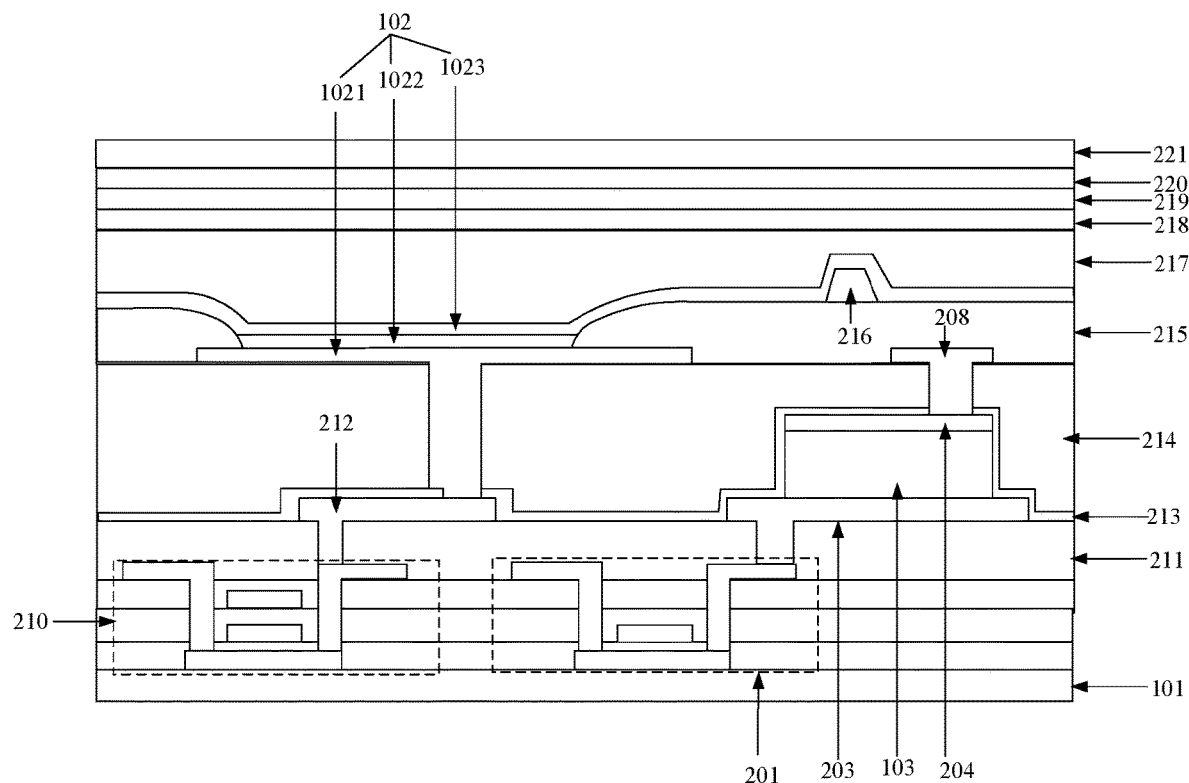
FIG. 10 is a schematic structural diagram of another array substrate according to an embodiment of the present disclosure.

Exemplarily, as shown in FIG. 10, the photoelectric drive circuit 201 in FIG. 8 may be disposed on a layer where the OLED drive circuit 210 is disposed, the first electrode 203 in FIG. 8 is disposed on a layer where the connecting electrode 212 is disposed, the photoelectric conversion layer 204 in FIG. 8 is disposed between the first electrode 203 and the second coverage layer 213, the second electrode 204 in FIG. 8 is disposed between the photoelectric conversion layer 103 and the second coverage layer 213, and the third electrode 208 in FIG. 8 is disposed on a layer where the first OLED electrode 1021 is disposed. Furthermore, the auxiliary substrate 105, the first passivation layer 202, the first coverage layer 205, the first flat layer 206, the second passivation layer 207, and the first buffer layer 209 in FIG. 8 may be omitted. In FIG. 10, the fingerprint recognition module and the OLED module are integrated to form the same module. It should be noted that a certain structure is disposed on a layer where another structure is disposed, which indicates that adjacent film layers of the two structures in a direction proximal to the base substrate are same, and adjacent film layers in a direction going distally from the base substrate are also same.

In the fourth implementation, an array substrate includes at least one fourth insulating layer and at least one fifth insulating layer, wherein the fourth insulating layer is disposed between an photoelectric conversion layer 103 and an electro-luminescence layer 1022 of an OLED, and the fifth insulating layer is disposed on a side, distal from a base substrate 101, of the electro-luminescence layer 1022 of the OLED. For example, the second coverage layer 213, the second flat layer 214, and the pixel defining layer 215 may all be the fourth insulating layer of the array substrate. The packaging layer 217, the first OCA layer 218, the insulating layer in the polarization and touch layer 219, the second OCA layer 220, and the cover plate 221 may all be the fifth insulating layer of the array substrate.

In the fourth implementation, at least one structure of at least one fourth insulating layer and at least one fifth insulating layer may be multiplexed to form the light-filtering layer (for example, the at least one structure is the light-filtering layer). Exemplarily, the at least one structure may be the second coverage layer 213 or the second flat layer 214 and the like in FIG. 8.

In the fourth implementation, the light-filtering layer may also be additionally disposed in the structure shown in FIG. 10. The light-filtering layer is disposed on a side, distal from the base substrate 101, of the photoelectric conversion layer 103, for example, the light-filtering layer is disposed between the second coverage layer 213 and the second flat layer 214, or the light-filtering layer is disposed between the OLED 1023 and the first OCA layer 218.

It may be known, from the several implementations of the structure of the array substrate, that the light-filtering layer may be disposed between the photoelectric conversion layer and the electro-luminescence layer of the OLED, or the light-filtering layer is disposed on a side, distal from the base substrate, of the electro-luminescence layer of the OLED. Furthermore, the array substrate may include the auxiliary substrate and may also not include the auxiliary substrate, the array substrate may include an optical collimating layer and may also not include the optical collimating layer.

In a first aspect, when the light-filtering layer is disposed between the photoelectric conversion layer and the electro-luminescence layer of the OLED and the array substrate includes an auxiliary substrate, the auxiliary substrate is disposed between the photoelectric conversion layer and the light-filtering layer, or the auxiliary substrate is disposed between the light-filtering layer and the OLED.

In a second aspect, when the light-filtering layer is disposed between the photoelectric conversion layer and the electro-luminescence layer of the OLED and the array substrate includes an auxiliary substrate and an optical collimating layer, the auxiliary substrate is disposed between the photoelectric conversion layer and the light-filtering layer, and the optical collimating layer is disposed between the photoelectric conversion layer and the auxiliary substrate; or the auxiliary substrate is disposed between the light-filtering layer and the auxiliary substrate, and the optical collimating layer is disposed between the auxiliary substrate and the light-filtering layer; or the auxiliary substrate is disposed between the light-filtering layer and the OLED, and the optical collimating layer is disposed between the photoelectric conversion layer and the light-filtering layer.

In a third aspect, when the light-filtering layer is disposed on a side, distal from the base substrate, of the electro-luminescence layer of the OLED and the array substrate includes an auxiliary substrate, the auxiliary substrate is disposed between the photoelectric conversion layer and the OLED.

In a fourth aspect, when the light-filtering layer is disposed on a side, distal from the base substrate, of the electro-luminescence layer of the OLED and the array substrate includes an auxiliary substrate and an optical collimating layer, the optical collimating layer is disposed between the photoelectric conversion layer and auxiliary substrate.

Figure 11:
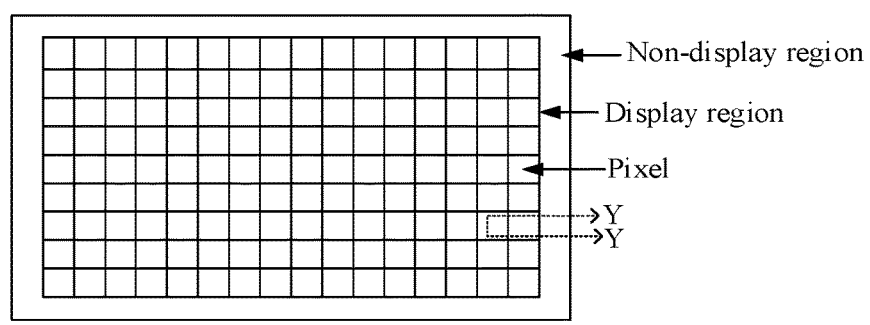
FIG. 11 is a top view of an array substrate according to an embodiment of the present disclosure.

Exemplarily, FIG. 11 is a top view of an array substrate according to an embodiment of the present disclosure. As shown in FIG. 11, the array substrate may include a display region and a non-display region, wherein the display region includes a plurality of pixels disposed in an array. FIG. 2, FIG. 6, FIG. 7, FIG. 8, FIG. 9 and FIG. 10 may all be schematic diagrams of a cross section in FIG. 11.

In conclusion, in the array substrate provided by the embodiment of the present disclosure, the light-filtering layer is disposed on a side, distal from the base substrate, of the photoelectric conversion layer and may filter a large amount of light with wavelengths greater than 600 nm. However, wavelengths of pigment light are generally 600 nm or above, such that a large amount of the pigment light excited by a finger of a user may be filtered by the light-filtering layer, thereby reducing the pigment light emitting to the photoelectric conversion layer. Therefore, the interference degree of the pigment light on fingerprint recognition may be reduced, and the accuracy of fingerprint recognition is improved.

FIG. 12 is a flowchart of a method for manufacturing an array substrate according to an embodiment of the present disclosure. The method is used for manufacturing any one of array substrates according to the embodiments of the present disclosure. As shown in FIG. 12, the method includes the following steps:

In step 1301, an OELD, a photoelectric conversion layer and a light-filtering layer are formed on an array substrate, wherein the OLED and the light-filtering layer being both disposed on a side, distal from a base substrate, of the photoelectric conversion layer; an orthographic projection of the photoelectric conversion layer on the base substrate at least partially overlaps an orthographic projection of the light-filtering layer on the base substrate, the orthographic projection of the photoelectric conversion layer on the base substrate falls out of an orthographic projection of the OLED on the base substrate; and the light-filtering layer is light transmittable, and a transmittance of the light-filtering layer to light in a target band is smaller than or equal to a transmittance threshold, wherein a minimum value of the target band is greater than 600 nm or above.

In conclusion, in the array substrate manufactured according to the method according to the embodiment of the present disclosure, the light-filtering layer is disposed on a side, distal from a base substrate, of the photoelectric conversion layer and can filter a large amount of light with the wavelengths greater than 600 nm. Furthermore, wavelengths of pigment light are generally 600 nm or above, and a large amount of pigment light excited by a finger of a user may be filtered by the light-filtering layer, thereby reducing the pigment light emitting to the photoelectric conversion layer. Therefore, the interference degree of the pigment light on fingerprint recognition may be reduced, and the accuracy of fingerprint recognition is improved.

It should be noted that the material of the light-filtering layer includes resin (such as polyethylene resin), or the light-filtering layer includes a plurality of first film layers and a plurality of second film layers. When the light-filtering layer includes the plurality of first film layers and the plurality of second film layers, the first film layers and the second film layers may be sequentially formed to obtain the light-filtering layer during preparation of the light-filtering layer.

Furthermore, the structure of the array substrate according to the embodiment of the present disclosure may also have various implementations, which is not limited in the embodiment of the present disclosure. Description will be made by taking the following several implementations of the structure of the array substrate as examples.

When the structure of the array substrate adopts the first implementation, the fingerprint recognition module and the OLED module may be respectively formed in the process of manufacturing the array substrate. Furthermore, the light-filtering layer may be disposed between the fingerprint recognition module and the OLED module. For example, the light-filtering layer is formed on a side, opposite to the side where the base substrate is disposed, of the fingerprint recognition module, or the auxiliary substrate is directly formed on the light-filtering layer when the auxiliary substrate is formed, or the light-filtering layer is attached onto the side where the auxiliary substrate is disposed in the OLED module.

When the structure of the array substrate adopts the second implementation, the light-filtering layer may not need to be disposed between the fingerprint recognition module and the OLED module may in the process of manufacturing the array substrate. However, at least one structure of the auxiliary substrate, at least one first insulating layer, at least one second insulating layer and at least one third insulating layer in the array substrate are multiplexed to form the light-filtering layer (for example, the at least one structure is the light-filtering layer). Furthermore, the structure multiplexed to form the light-filtering layer is the same as the structure of the light-filtering layer described in the embodiment of the present disclosure.

When the structure of the array substrate adopts the third implementation, the fingerprint recognition module and the OLED module may be respectively formed in the process of manufacturing the array substrate. Furthermore, the optical collimating layer may be disposed between the fingerprint recognition module and the OLED module, and the light-filtering layer is disposed between the optical collimating layer and the fingerprint recognition module (or the light-filtering layer is disposed between the optical collimating layer and the OLED module).

When the structure of the array substrate adopts the fourth implementation, the OLED module and the fingerprint recognition module may be simultaneously formed in the process of manufacturing the array substrate, and a part of the insulating layers are multiplexed to form the light-filtering layer. Furthermore, the structure multiplexed to form the light-filtering layer is the same as the structure of the light-filtering layer described in the embodiment of the present disclosure. Or the light-filtering layer is formed on a side, distal from the base substrate, of the photoelectric conversion layer in the process of manufacturing the OLED module and the fingerprint recognition module.

It should be noted that the schematic descriptions above are only process of manufacturing several array substrates. The array substrate may be manufactured according to the structure of each of the film layers in the array substrate during manufacturing of the array substrate, which is not limited in the embodiment of the present disclosure.

The embodiment of the present disclosure provides a display device. The display device includes any one of array substrates according to the embodiments of the present disclosure. Exemplarily, the display device may be any product or part with a display function, such as a electronic paper, an OLED panel, a mobile phone, a tablet personal computer, a television, a display, a notebook computer, a digital photo frame, a navigator, or the like.

In the present disclosure, the term "at least one" refers to one or more, the term "a plurality of" refers to two or more than two. The term "at least one of following items" or like expressions refer to an arbitrary combination of these items, including a single item or a plurality of items. For example, at least one of a, b and c may refer to a, b, c, (a+b), (a+c), (b+c) or (a+b+c), wherein a, b, c may be the single item or may also be the plurality of items.

It should be noted a part of layers or all layers or a part of regions or all regions in the accompanying drawings may be oversized for clear clarity of illustration. It should be understood that elements or layers, when being disposed on another element or layer, may be directly disposed on other elements, or an intermediate layer may exist. In addition, it should be understood that elements or layers, when being disposed under another element or layer, may be directly disposed under other elements, or more than one intermediate layer or element may exist. In addition, it should further be understood that layers or elements, when being disposed between two layers or two elements, may be a unique layer between the two layers or the two elements, or more than one intermediate layer or element may also exist. Like reference numerals in the entire description represent like elements.

It should be noted that, the embodiments of the method according to the present disclosure may be cross-referenced to the embodiments of the corresponding array substrate, which are not limited in the embodiments of the present disclosure. The sequence of the steps of the embodiments of the method according the present disclosure may be properly adjusted, the steps may be increased or reduced correspondingly according to the conditions, and any methods which those skilled in the art may think in the technical scope disclosed by the present disclosure should be covered within the protection scope of the present disclosure, which is not elaborated herein.

Described above are only optional embodiments of the present disclosure, but are not intended to limit the present disclosure; and any modifications, equivalent substitutions, improvements and the like made within the spirit and principles of the present disclosure are all intended to be concluded in the protection scope of the present disclosure.

What is claimed is:

1. An array substrate, comprising a base substrate and an organic light-emitting diode (OLED), a photoelectric conversion layer and a light-filtering layer which are on the base substrate; wherein
the OLED and the light-filtering layer are both on a side, away from the base substrate, of the photoelectric conversion layer, an orthographic projection of the photoelectric conversion layer on the base substrate is at least partially overlapped with an orthographic projection of the light-filtering layer on the base substrate, and the orthographic projection of the photoelectric conversion layer on the base substrate is outside an orthographic projection of the OLED on the base substrate; and
the light-filtering layer is light transmittable, and a transmittance of the light-filtering layer to light in a target band is smaller than or equal to a transmittance threshold, a minimum value of the target band being greater than 600 nanometers.

2. The array substrate according to claim 1, wherein the transmittance of the light-filtering layer to light with at least a part of wavelengths outside the target band is greater than the transmittance threshold.

3. The array substrate according to claim 2, wherein the at least a part of wavelengths comprise wavelengths from 480 nanometers to 580 nanometers.

4. The array substrate according to claim 1, wherein the light-filtering layer comprises a plurality of first film layers and a plurality of second film layers;
wherein in the light-filtering layer, the first film layers and the second film layers are alternatively overlapped in a direction going away from the base substrate, and refractive indexes of the first film layers are greater than those of the second film layers.

5. The array substrate according to claim 4, wherein a material of the first film layers comprises trititanium pentoxide, and a material of the second film layers comprises silica.

6. The array substrate according to claim 4, wherein a material of the first film layers comprises titanium dioxide, and a material of the second film layers comprises silica.

7. The array substrate according to claim 4, wherein the light-filtering layer comprises six first film layers and six second film layers.

8. The array substrate according to claim 1, wherein the transmittance threshold is one hundredth.

9. The array substrate according to claim 1, wherein a material of the light-filtering layer comprises resin.

10. The array substrate according to claim 1, wherein the light-filtering layer is between the photoelectric conversion layer and an electro-luminescence layer of the OLED.

11. The array substrate according to claim 10, further comprising an auxiliary substrate; and the array substrate conforms to any one of the following conditions:
the auxiliary substrate is between the photoelectric conversion layer and the light-filtering layer; and
the auxiliary substrate is between the light-filtering layer and the OLED.

12. The array substrate according to claim 10, further comprising an auxiliary substrate and an optical collimating layer; and the array substrate conforms to any one of the following conditions:
the auxiliary substrate is between the photoelectric conversion layer and the light-filtering layer, and the optical collimating layer is between the photoelectric conversion layer and the auxiliary substrate;
the auxiliary substrate is between the light-filtering layer and the OLED, and the optical collimating layer is between the auxiliary substrate and the light-filtering layer; and
the auxiliary substrate is between the photoelectric conversion layer and the OLED, and the optical collimating layer is between the photoelectric conversion layer and the light-filtering layer.

13. The array substrate according to claim 1, wherein the light-filtering layer is on a side, distal from the base substrate, of an electro-luminescence layer of the OLED.

14. The array substrate according to claim 13, further comprising an auxiliary substrate between the photoelectric conversion layer and OLED.

15. The array substrate according to claim 14, further comprising an optical collimating layer between the photoelectric conversion layer and the auxiliary substrate.

16. The array substrate according to claim 3, wherein the transmittance threshold is one hundredth; and the array substrate conforms to any one condition in a first condition set and any one condition in a second condition set; wherein
the first condition set comprises:
a material of the light-filtering layer comprises resin;
the light-filtering layer comprises six first film layers and six second film layers, wherein in the light-filtering layer, the first film layers and the second film layers are alternatively overlapped in a direction going distally from the base substrate, a material of the first film layers comprises trititanium pentoxide, and a material of the second film layers comprises silica; and
the light-filtering layer comprises six first film layers and six second film layers, wherein in the light-filtering layer, the first film layers and the second film layers are alternatively overlapped in a direction going distally from the base substrate, a material of the first film layers comprises titanium oxide, and a material of the second film layers comprises silica; and
the second condition set comprises:
the light-filtering layer is between the photoelectric conversion layer and the electro-luminescence layer of the OLED;
the light-filtering layer is between the photoelectric conversion layer and the electro-luminescence layer of the OLED, and the array substrate further comprises an auxiliary substrate between the photoelectric conversion layer and the light-filtering layer;
the light-filtering layer is between the photoelectric conversion layer and the electro-luminescence layer of the OLED, and the array substrate further comprises an auxiliary substrate between the light-filtering layer and the OLED;
the light-filtering layer is between the photoelectric conversion layer and the electro-luminescence layer of the OLED, and the array substrate further comprises an auxiliary substrate and an optical collimating layer, wherein the auxiliary substrate is between the photoelectric conversion layer and the light-filtering layer, and the optical collimating layer is between the photoelectric conversion layer and the auxiliary substrate;
the light-filtering layer is between the photoelectric conversion layer and the electro-luminescence layer of the OLED, and the array substrate further comprises an auxiliary substrate and an optical collimating layer, wherein the auxiliary substrate is between the light-filtering layer and the OLED, and the optical collimating layer is between the auxiliary substrate and the light-filtering layer;
the light-filtering layer is between the photoelectric conversion layer and the electro-luminescence layer of the OLED, and the array substrate further comprises an auxiliary substrate and an optical collimating layer, wherein the auxiliary substrate is between the light-filtering layer and the OLED, and the optical collimating layer is between the photoelectric conversion layer and the light-filtering layer;
the light-filtering layer is on a side, distal from the base substrate, of the electro-luminescence layer of the OLED;
the light-filtering layer is on a side, distal from the base substrate, of the electro-luminescence layer of the OLED, and the array substrate further comprises an auxiliary substrate between the photoelectric conversion layer and the OLED; and
the light-filtering layer is on a side, distal from the base substrate, of the electro-luminescence layer of the OLED, and the array substrate further comprises an auxiliary substrate between the photoelectric conversion layer and the OLED and an optical collimating layer between the photoelectric conversion layer and the auxiliary substrate.

17. A method for manufacturing an array substrate, comprising:
forming an OLED, a photoelectric conversion layer, and a light-filtering layer on a base substrate;
wherein the OLED and the light-filtering layer are both on a side, distal from the base substrate, of the photoelectric conversion layer, an orthographic projection of the photoelectric conversion layer on the base substrate at least partially is overlapped with an orthographic projection of the light-filtering layer on the base substrate, and the orthographic projection of the photoelectric conversion layer on the base substrate is outside an orthographic projection of the OLED on the base substrate; and
the light-filtering layer is light transmittable, and a transmittance of the light-filtering layer to light in a target band is smaller than or equal to a transmittance threshold, a minimum value of the target band being greater than 600 nanometers.

18. The method according to claim 17, wherein the transmittance of the light-filtering layer to light with at least a part of wavelengths outside the target band is greater than the transmittance threshold, wherein the at least a part of wavelengths comprise wavelengths from 480 nanometers to 580 nanometers, and the transmittance threshold is one hundredth; and the array substrate is in conformity with to any one condition in a first condition set and any one condition in a second condition set; wherein
the first condition set comprises:
a material of the light-filtering layer comprises resin;
the light-filtering layer comprises six first film layers and six second film layers, wherein in the light-filtering layer, the first film layers and the second film layers are alternatively overlapped in a direction going distally from the base substrate, a material of the first film layers comprises trititanium pentoxide, and a material of the second film layers comprises silica; and
the light-filtering layer comprises six first film layers and six second film layers, wherein in the light-filtering layer, the first film layers and the second film layers are alternatively overlapped in a direction going distally from the base substrate, a material of the first film layers comprises titanium oxide, and a material of the second film layers comprises silica; and
the second condition set comprises:
the light-filtering layer is between the photoelectric conversion layer and the electro-luminescence layer of the OLED;
the light-filtering layer is between the photoelectric conversion layer and the electro-luminescence layer of the OLED, and the array substrate further comprises an auxiliary substrate between the photoelectric conversion layer and the light-filtering layer;
the light-filtering layer is between the photoelectric conversion layer and the electro-luminescence layer of the OLED, and the array substrate further comprises an auxiliary substrate between the light-filtering layer and the OLED;
the light-filtering layer is between the photoelectric conversion layer and the electro-luminescence layer of the OLED, and the array substrate further comprises an auxiliary substrate and an optical collimating layer, wherein the auxiliary substrate is between the photoelectric conversion layer and the light-filtering layer, and the optical collimating layer is between the photoelectric conversion layer and the auxiliary substrate;

the light-filtering layer is between the photoelectric conversion layer and the electro-luminescence layer of the OLED, and the array substrate further comprises an auxiliary substrate and an optical collimating layer, wherein the auxiliary substrate is between the light-filtering layer and the OLED, and the optical collimating layer is between the auxiliary substrate and the light-filtering layer;

the light-filtering layer is between the photoelectric conversion layer and the electro-luminescence layer of the OLED, and the array substrate further comprises an auxiliary substrate and an optical collimating layer, wherein the auxiliary substrate is between the light-filtering layer and the OLED, and the optical collimating layer is between the photoelectric conversion layer and the light-filtering layer;

the light-filtering layer is on a side, distal from the base substrate, of the electro-luminescence layer of the OLED;

the light-filtering layer is on a side, distal from the base substrate, of the electro-luminescence layer of the OLED, and the array substrate further comprises an auxiliary substrate between the photoelectric conversion layer and the OLED;

and the light-filtering layer is on a side, distal from the base substrate, of the electro-luminescence layer of the OLED, and the array substrate further comprises an auxiliary substrate between the photoelectric conversion layer and the OLED and an optical collimating layer between the photoelectric conversion layer and the auxiliary substrate.

19. A display device, comprising the array substrate as defined in claim 1.

20. The display device according to claim 19, wherein the transmittance of the light-filtering layer to light with at least a part of wavelengths outside the target band is greater than the transmittance threshold, the at least a part of wavelengths comprising wavelengths from 480 nanometers to 580 nanometers, the transmittance threshold being one hundredth; and the array substrate conforms to any one condition in a first condition set and any one condition in a second condition set; wherein the first condition set comprises:

a material of the light-filtering layer comprises resin;

the light-filtering layer comprises six first film layers and six second film layers, wherein in the light-filtering layer, the first film layers and the second film layers are alternatively overlapped in a direction going distally from the base substrate, a material of the first film layers comprises trititanium pentoxide, and a material of the second film layers comprises silica; and the light-filtering layer comprises six first film layers and six second film layers, wherein in the light-filtering layer, the first film layers and the second film layers are alternatively overlapped in a direction going distally from the base substrate, a material of the first film layers comprises titanium oxide, and a material of the second film layers comprises silica; and the second condition set comprises:

the light-filtering layer is between the photoelectric conversion layer and the electro-luminescence layer of the OLED;

the light-filtering layer is between the photoelectric conversion layer and the electro-luminescence layer of the OLED, and the array substrate further comprises an auxiliary substrate between the photoelectric conversion layer and the light-filtering layer;

the light-filtering layer is between the photoelectric conversion layer and the electro-luminescence layer of the OLED, and the array substrate further comprises an auxiliary substrate between the light-filtering layer and the OLED;

the light-filtering layer is between the photoelectric conversion layer and the electro-luminescence layer of the OLED, and the array substrate further comprises an auxiliary substrate and an optical collimating layer, wherein the auxiliary substrate is between the photoelectric conversion layer and the light-filtering layer, and the optical collimating layer is between the photoelectric conversion layer and the auxiliary substrate;

the light-filtering layer is between the photoelectric conversion layer and the electro-luminescence layer of the OLED, and the array substrate further comprises an auxiliary substrate and an optical collimating layer, wherein the auxiliary substrate is between the light-filtering layer and the OLED, and the optical collimating layer is between the auxiliary substrate and the light-filtering layer;

the light-filtering layer is between the photoelectric conversion layer and the electro-luminescence layer of the OLED, and the array substrate further comprises an auxiliary substrate and an optical collimating layer, wherein the auxiliary substrate is between the light-filtering layer and the OLED, and the optical collimating layer is between the photoelectric conversion layer and the light-filtering layer;

the light-filtering layer is on a side, distal from the base substrate, of the electro-luminescence layer of the OLED;

the light-filtering layer is on a side, distal from the base substrate, of the electro-luminescence layer of the OLED, and the array substrate further comprises an auxiliary substrate between the photoelectric conversion layer and the OLED;

and the light-filtering layer is on a side, distal from the base substrate, of the electro-luminescence layer of the OLED, and the array substrate further comprises an auxiliary substrate between the photoelectric conversion layer and the OLED and an optical collimating layer between the photoelectric conversion layer and the auxiliary substrate.

* * * * *